US012648420B2

(12) United States Patent
Tomczak et al.

(10) Patent No.: US 12,648,420 B2
(45) Date of Patent: Jun. 2, 2026

(54) METHOD OF FORMING PATTERNED STRUCTURES

(71) Applicant: ASM IP Holding, B.V., Almere (NL)

(72) Inventors: Yoann Tomczak, Leuven (BE); Ivan Zyulkov, Brussels (BE); David Kurt de Roest, Leuven (BE); Michael Eugene Givens, Oud-Heverlee (BE); Daniele Piumi, Etterbeek (BE); Charles Dezelah, Helsinki (FI)

(73) Assignee: ASM IP Holding, B.V., Almere (NL)

( * ) Notice: Subject to any disclaimer, the term of this patent is extended or adjusted under 35 U.S.C. 154(b) by 844 days.

(21) Appl. No.: 17/818,062

(22) Filed: Aug. 8, 2022

(65) Prior Publication Data

US 2023/0059464 A1 Feb. 23, 2023

Related U.S. Application Data

(60) Provisional application No. 63/231,468, filed on Aug. 10, 2021.

(51) Int. Cl.

*H01L 21/768* (2006.01)
*G03F 7/004* (2006.01)
*G03F 7/20* (2006.01)
*H01L 21/027* (2006.01)
*H01L 21/285* (2006.01)

(52) U.S. Cl.

CPC ...... *H01L 21/76879* (2013.01); *G03F 7/0045* (2013.01); *G03F 7/2004* (2013.01); *H01L 21/0274* (2013.01); *H01L 21/28562* (2013.01)

(58) Field of Classification Search

CPC ....... H01L 21/02636–02642; H01L 21/28562; H01L 21/76262; H01L 21/76294; H01L 21/76879; H01L 21/02205–02222; H10K 71/166; C23C 14/04–048; C23C 16/04–047

See application file for complete search history.

(56) References Cited

U.S. PATENT DOCUMENTS

| | | | |
|---|---|---|---|
| 9,425,059 | B2 | 8/2016 | Park |
| 9,929,012 | B1 | 3/2018 | Belyansky |
| 10,347,486 | B1 | 7/2019 | De Silva |
| 10,551,742 | B2 | 2/2020 | Xu |
| 10,782,606 | B2 | 9/2020 | Liang |
| 10,998,191 | B2 | 5/2021 | Church |

(Continued)

FOREIGN PATENT DOCUMENTS

| | | |
|---|---|---|
| KR | 20200038425 A | 4/2020 |

OTHER PUBLICATIONS

Miles Wilklow-Marnell, et al. "First-row transitional-metal oxalate resists for EUV," J. Micro/Nanolith. MEMS MOEMS 17(4) 043507 (Dec. 19, 2018).

*Primary Examiner* — Wael M Fahmy
*Assistant Examiner* — Quinton A Brasfield
(74) *Attorney, Agent, or Firm* — Banner & Witcoff, Ltd.

(57) ABSTRACT

Methods of forming patterned features on a surface of a substrate are disclosed. Exemplary methods include gas-phase formation of a layer comprising an oxalate compound on a surface of the substrate. Portions of the layer comprising the oxalate compound can be exposed to radiation or active species that form exposed and unexposed portions. Material can be selectively deposed onto the exposed or the unexposed portions.

20 Claims, 3 Drawing Sheets

(56) References Cited

U.S. PATENT DOCUMENTS

| | | | | |
|---|---|---|---|---|
| 11,314,168 | B2 * | 4/2022 | Tan | H01L 21/02115 |
| 11,550,222 | B2 | 1/2023 | Singh | |
| 11,830,732 | B2 | 11/2023 | Maes et al. | |
| 2019/0333761 | A1 | 10/2019 | Tois et al. | |
| 2019/0368040 | A1 * | 12/2019 | Kachel | C23C 16/45559 |
| 2021/0033977 | A1 * | 2/2021 | Raaijmakers | G03F 7/265 |
| 2021/0397085 | A1 | 12/2021 | Weidman | |
| 2022/0197147 | A1 | 6/2022 | Liang | |
| 2022/0342301 | A1 | 10/2022 | Weidman | |
| 2022/0365434 | A1 | 11/2022 | Nardi | |

* cited by examiner

METHOD OF FORMING PATTERNED STRUCTURES

CROSS REFERENCE TO RELATED APPLICATIONS

This Application claims the benefit of U.S. Provisional Application 63/231,468 filed on Aug. 10, 2021, which is hereby incorporated by reference in its entirety.

FIELD OF INVENTION

The present disclosure generally relates to methods of forming structures suitable for use in the manufacture of electronic devices. More particularly, the disclosure relates to methods of forming patterned features using an oxalate derivative precursor and to structures including the patterned features.

BACKGROUND OF THE DISCLOSURE

During the manufacture of electronic devices, fine patterns of features can be formed on a surface of a substrate by patterning the surface of the substrate and etching material from the substrate surface using, for example, gas-phase etching processes. As a density of devices on a substrate increases, it generally becomes increasingly desirable to form features with smaller dimensions.

Photoresist is often used to pattern a surface of a substrate prior to etching. A pattern can be formed in the photoresist by applying a layer of photoresist to a surface of the substrate, masking the surface of the photoresist, exposing the unmasked portions of the photoresist to radiation, such as ultraviolet light, and developing a portion of the photoresist to remove the unmasked or masked portion of the photoresist, while leaving the other of the unmasked and masked portion of the photoresist on the substrate surface.

Recently, extreme ultraviolet (EUV) lithography techniques have been developed to use EUV wavelengths and EUV photoresist to form patterns having relatively small pattern features. Future developments in EUV lithography, such as high-numerical aperture lens EUV (high NA EUV) and continued scaling of features (for instance, line space critical dimensions of less than 16 nm) often contemplate the use of a patterning stack that includes several layers (e.g., EUV photoresist, a photoresist underlayer, and a hard mask) to decrease material layer thicknesses, while maintaining desired etch contrast between materials and low defectivity in patterned features. While such techniques may work for some applications, the techniques generally employ a relatively large number of steps, which can result in unwanted cost. Further, such techniques employ a developing step, which uses expensive equipment and chemicals, and which can be relatively time consuming. Accordingly, improved methods of forming patterned features are desired.

Any discussion of problems and solutions set forth in this section has been included in this disclosure solely for the purpose of providing a context for the present disclosure and should not be taken as an admission that any or all of the discussion was known at the time the invention was made.

SUMMARY OF THE DISCLOSURE

Various embodiments of the present disclosure relate to methods of forming patterned features on a surface of a substrate and to structures formed using the methods. While the ways in which various embodiments of the present disclosure address drawbacks of prior methods and structures are discussed in more detail below, in general, various embodiments of the disclosure provide methods of forming relatively fine or small patterned features with relatively few steps. For example, as set forth in more detail below, methods of forming patterned features may not include a step of developing photoresist.

In accordance with exemplary embodiments of the disclosure, a method of forming a structure includes providing a substrate within a gas-phase reaction chamber, providing an oxalate derivative precursor to the reaction chamber, and forming a layer comprising an oxalate compound on a surface of the substrate within the reaction chamber. The oxalate derivative precursor can include a halide and a hydrocarbyl group attached to an oxalate derivative backbone. By way of examples, the oxalate derivative precursor can be or include a compound having a chemical structure according to formula (i), (i)

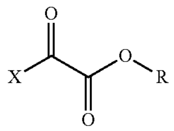

wherein X is a halogen and R is a hydrocarbyl group. By way of further examples, R can be or include a linear alkyl, a cyclic alkyl, a linear alkenyl, a cyclic alkenyl, or an aryl. Additionally or alternatively, R can be or include a C1-C6 compound. In accordance with examples of these embodiments, the layer comprising the oxalate compound forms a self-assembled monolayer on the surface. Exemplary methods can further include a step of exposing portions of the layer comprising an oxalate compound to one or more of radiation and excited species to form exposed portions and unexposed portions. The step of exposing can alter a hydrophobicity of the exposed portions. In accordance with yet further examples of these embodiments, the method includes a step of selectively depositing material on the exposed portions or a step of selectively depositing material on the unexposed portions.

In accordance with further examples of the disclosure, a structure is formed according to the method as described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
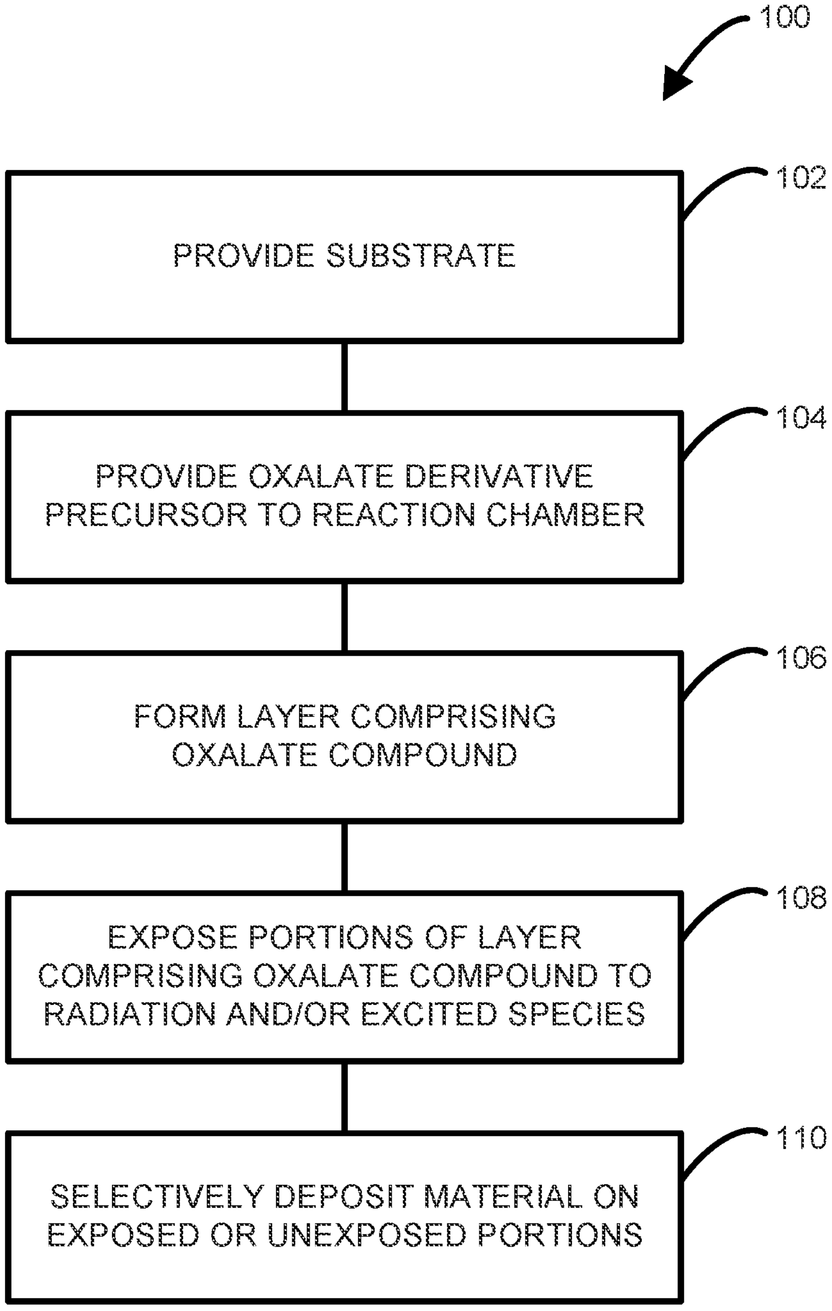
FIG. 1 illustrates a method of forming patterned features on a surface of a substrate in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood that the invention extends beyond the specifically disclosed embodiments and/or uses thereof and obvious modifications and equivalents thereof. Thus, it is intended that the scope of the invention disclosed should not be limited by the particular disclosed embodiments described below.

The present disclosure generally relates to methods of forming patterned features on a surface of a substrate. Exemplary methods can be used to form structures used during the formation of electronic devices. The methods can be used to form structures having features with relatively high pitch and/or relatively small dimensions, such as relatively small line space critical dimensions. Further, such structures can be formed using relatively few steps and/or using less-expensive equipment.

As used herein, the term substrate may refer to any underlying material or materials including and/or upon which one or more layers can be deposited. A substrate can include a bulk material, such as silicon (e.g., single-crystal silicon), other Group IV materials, such as germanium, or compound semiconductor materials, such as GaAs, and can include one or more layers overlying or underlying the bulk material. For example, a substrate can include a patterning stack of several layers overlying bulk material. The patterning stack can vary according to application. Further, the substrate can additionally or alternatively include various features, such as recesses, lines, and the like formed within or on at least a portion of a layer of the substrate.

In some embodiments, film refers to a layer extending in a direction perpendicular to a thickness direction. In some embodiments, layer refers to a material having a certain thickness formed on a surface or a synonym of film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers. Further, a layer or film can be continuous or discontinuous.

In this disclosure, gas may include material that is a gas at normal temperature and pressure, a vaporized solid and/or a vaporized liquid, and may be constituted by a single gas or a mixture of gases, depending on the context. In some cases, such as in the context of deposition of material, the term precursor can refer to a compound that participates in the chemical reaction that produces another compound, and particularly to a compound that constitutes a film matrix or a main skeleton of a film. In some cases, the terms precursor and reactant can be used interchangeably. The term inert gas refers to a gas that does not take part in a chemical reaction to an appreciable extent and/or a gas that excites a precursor when, for example, RF or microwave power is applied, but unlike a reactant, it may not become a part of a film matrix to an appreciable extent.

The term cyclic deposition process or cyclical deposition process may refer to the sequential introduction of precursors (and/or reactants) into a reaction chamber to deposit a layer over a substrate and includes processing techniques, such as atomic layer deposition (ALD), cyclical chemical vapor deposition (cyclical CVD), and hybrid cyclical deposition processes that include an ALD component and a cyclical CVD component.

The term atomic layer deposition may refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es), and purge (e.g., inert carrier) gas(es).

In this disclosure, any two numbers of a variable can constitute a workable range of the variable, and any ranges indicated may include or exclude the endpoints. Additionally, any values of variables indicated (regardless of whether they are indicated with about or not) may refer to precise values or approximate values and include equivalents, and may refer to average, median, representative, majority, etc. in some embodiments. Further, in this disclosure, the terms including, constituted by and having can refer independently to typically or broadly comprising, comprising, consisting essentially of, or consisting of in some embodiments. In accordance with aspects of the disclosure, any defined meanings of terms do not necessarily exclude ordinary and customary meanings of the terms.

Turning now to the figures, FIG. 1 illustrates a method 100 in accordance with exemplary embodiments of the disclosure. Method 100 includes the steps of providing a substrate within a gas-phase reaction chamber (step 102), providing an oxalate derivative precursor to the reaction chamber (step 104), and forming a layer comprising an oxalate compound on a surface of the substrate within the reaction chamber (step 106). Method 100 can also include exposing portions of the layer comprising an oxalate compound to one or more of radiation and excited species (step 108) and selectively depositing material on exposed or unexposed portions (step 110).

Figure 2:
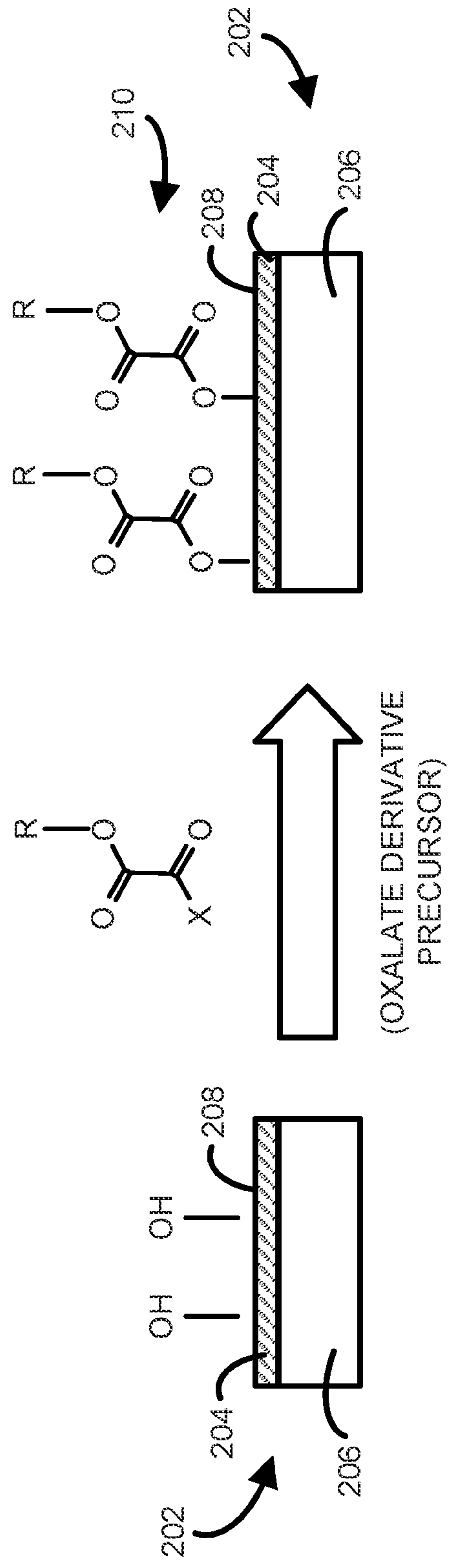
FIG. 2 illustrates a step of forming a layer comprising an oxalate compound on a surface of the substrate within a reaction chamber in accordance with exemplary embodiments of the disclosure.

Step 102 includes providing a substrate, such as a substrate described herein. The substrate can include one or more layers, including one or more material layers, to be etched. The substrate can include several layers underlying the material layer(s) to be etched. By way of examples, the substrate can include a surface including an oxide, such as a metal—e.g., a transition metal oxide such as hafnium oxide or aluminum oxide, or a post transition metal oxide such as aluminum oxide, or a rare earth metal oxide such as lanthanum oxide or cerium oxide. Additionally or alternatively, the surface can include one or more of silicon oxide and silicon oxycarbide. Metal oxide, silicon oxides, and silicon oxycarbides, as described herein, can include additional elements, such as nitrogen and carbon, and need not necessarily be stoichiometric. In accordance with examples of the disclosure, the substrate surface includes hydroxyl terminal groups. FIG. 2 illustrates a substrate 202, including a layer 204, overlying material 206, and having a surface 208. As illustrated, surface 208 includes hydroxyl terminal groups.

During step 102, the reaction chamber can be brought to a desired temperature and pressure for subsequent processing (e.g., step 104). For example, the reaction chamber or a susceptor therein can be controlled to a temperature of about 20° C. to about 400° C., about 50° C. to about 200° C., about 20° C. to about 250° C., or about 50° C. to about 150° C. A pressure within the reaction chamber can be between about 0.1 torr and about 10 torr or about 1 and about 10 torr.

During step 104, an oxalate derivative precursor is provided to the reaction chamber. The oxalate derivative precursor can be provided by, for example, heating a vessel comprising a precursor source. The vessel temperature can be set to, for example, about 10° C. to about 60° C. or about 15° C. to about 25° C. or about 0° C. to about 200° C. or about 20° C. to about 100° C. The oxalate derivative precursor can be delivered to a reaction space of a reaction chamber using a gas distribution device, such as a showerhead.

In accordance with various examples, the oxalate derivative precursor includes a halide, such as one or more of F, Cl, Br, and I. In accordance with further examples, the oxalate derivative precursor includes a hydrocarbyl oxalyl halide.

Exemplary compounds suitable for the oxalate derivative precursor include one or more compounds having a chemical structure according to formula (i), (i)

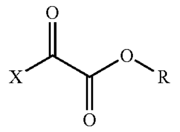

where X is a halogen (e.g., F, Cl, Br, or I) and R is a hydrocarbyl group. R can be a linear alkyl, a cyclic alkyl, a linear alkenyl, a cyclic alkenyl, or aryl. For example, R can be a C1-C6 linear alkyl or linear alkenyl or a C3-C8 cyclic alkyl, cyclic alkenyl, or aryl. In some cases, R can be a haloalkyl, such as any of a C1 to C4 alkyl, in which one or more hydrogens are substituted by a halogen, such as F, Cl, Br, and/or I. Specific examples of such groups include $CH_2Cl$, $CH_3CHF$, $CH_2BrCH_2$, $CH_2ICHI$. Particular exemplary oxalate derivative precursors can be selected from the group consisting of: acetic acid, 2-chloro-2-oxo-, 1,1-dimethylethyl ester ($C_6H_9ClO_3$); acetic acid, 2-chloro-2-oxo-, 2-propen-1-yl ester ($C_5H_5ClO_3$); acetic acid, 2-chloro-2-oxo-, methyl ester ($C_3H_3ClO_3$); acetic acid, 2-chloro-2-oxo-, 2,2-dimethylpropyl ester ($C_7H_{11}ClO_3$); acetic acid, 2-chloro-2-oxo-, phenylmethyl ester ($C_9H_2ClO_3$); acetic acid, 2-chloro-2-oxo-, and 2,2,2-trifluoroethyl ester ($C_4H_2ClF_3O_3$). By way of specific example, X can be Cl and/or R can be an ethyl group. In these cases, the precursor can be or include ethyl oxalyl chloride.

As illustrated in FIGS. 1 and 2, once or as the oxalate derivative precursor is provided to the reaction chamber, step 106 of forming a layer 210 comprising an oxalate compound occurs on surface 208 of substrate 202 within the reaction chamber. As illustrated in FIG. 2, layer comprising the oxalate compound 210 can form as a self-assembled monolayer on surface 208.

Figure 3:
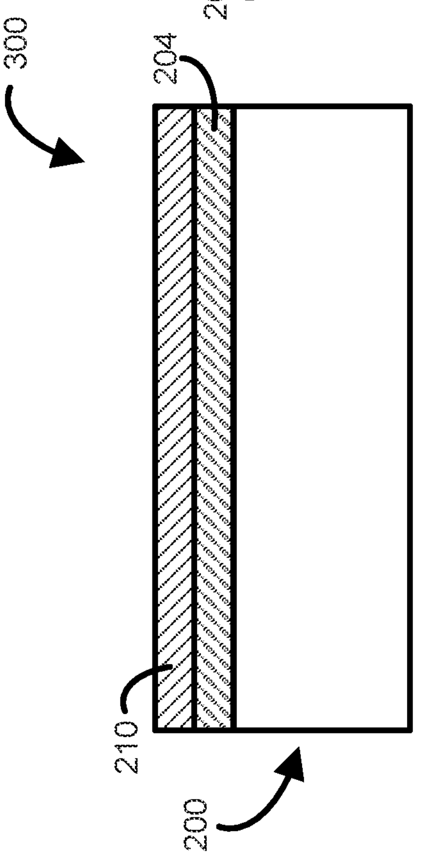
FIGS. 3-6 illustrate structures in accordance with exemplary embodiments of the disclosure.
Figure 4:
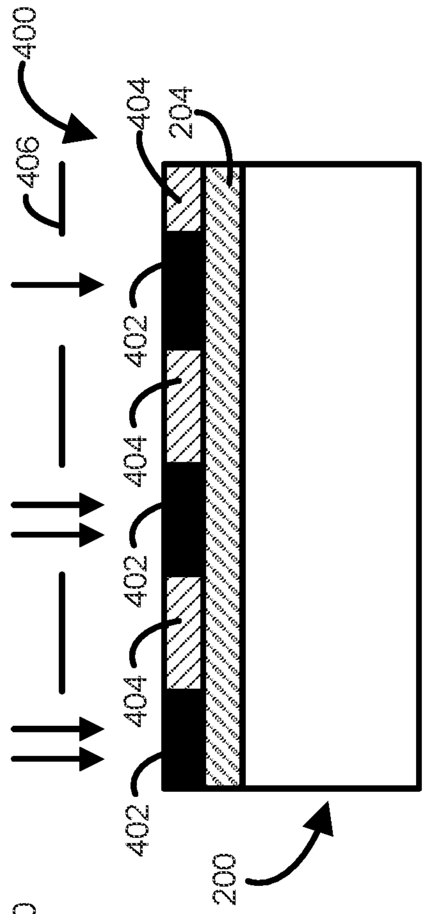

During step 106, the oxalate derivative precursor can anchor to the surface of the substrate by reacting the C—X end of the compound, thereby forming a layer comprising an oxalate compound on a surface of the substrate within the reaction chamber. Once layer 210 forms, substrate 202 can be removed from the reaction chamber. FIG. 3 illustrates a structure 300, including layer comprising the oxalate compound 210.

Once layer comprising the oxalate compound 210 is formed, during step 108, portions of layer comprising an oxalate compound 210 can be exposed to one or more of radiation and excited species to form structure 400, including exposed portions 402 and unexposed portions 404 of layer 210. Unexposed portions 404 can be formed by masking a portion of layer comprising an oxalate compound 210—e.g., using a mask 406. The step of exposing can include, for example, exposing the portions to radiation, such as extreme ultraviolet radiation, excited species, such as radicals or ions, or the like. An exemplary EUV dose during step 108 can be, for example, between about 10 and about 150 $mJ/cm^2$.

The exposure to radiation and/or active species can alter a surface property, such as a hydrophobicity (e.g., as measured using water contact angle tests) of the exposed portions. For example, the step of exposing can cause the exposed portions to become more hydrophobic than the unexposed portions. Not to be bound by theory, one explanation for the increase in hydrophobicity and/or other surface property change is that, in the exposed portions, the oxalate compound on a surface of the substrate polymerizes. The change in surface properties can be used to facilitate selective deposition during step 110.

During step 110, material is selectively deposited on exposed portions 402 or unexposed portions 404. Material that is deposited during step 110 can include, any suitably selectively-deposited material, such as for example, a metal, such as Ru; a metal oxide, such as aluminum oxide, titanium oxide, tin oxide, or indium oxide; a carbide such as aluminum carbide, or a nitride such as silicon nitride or titanium nitride. The material that is selectively deposited can be used as a hard mask to etch underlying layers, such as a portion of substrate 202 (e.g., a portion of layer 204). Alternatively, the material that is selectively deposited can become a permanent component of an integrated circuit.

Figure 5:
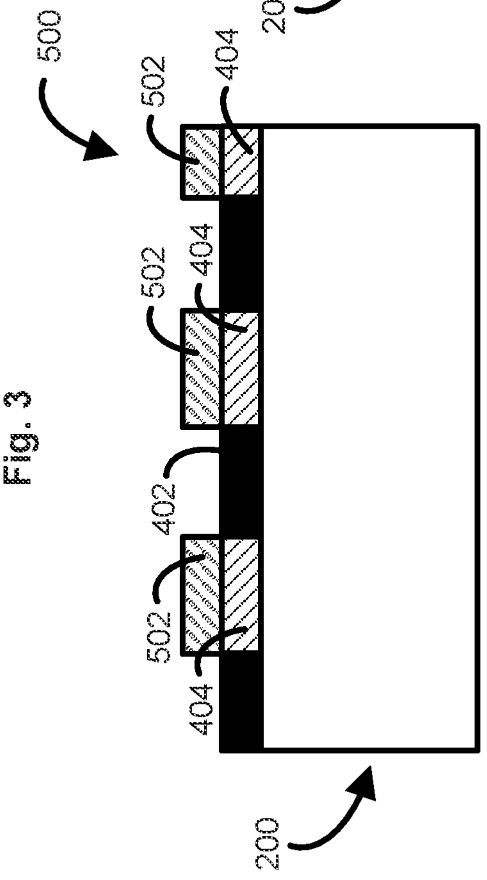

In some cases, layer comprising an oxalate compound 210 can be thought of as a negative-tone resist-like material; in other cases, layer comprising an oxalate compound 210 can be thought of as a positive-tone resist-like material, depending on whether step 108 causes expose portions 402 to be more hydrophobic or more hydrophilic, compared to unexposed portions 404. FIG. 5 illustrates a structure 500, in which material 502 is selectively deposited (e.g., directly) onto unexposed portions 404. In this case, layer comprising an oxalate compound 210 can be thought of as a negative-tone resist-like material.

Figure 6:
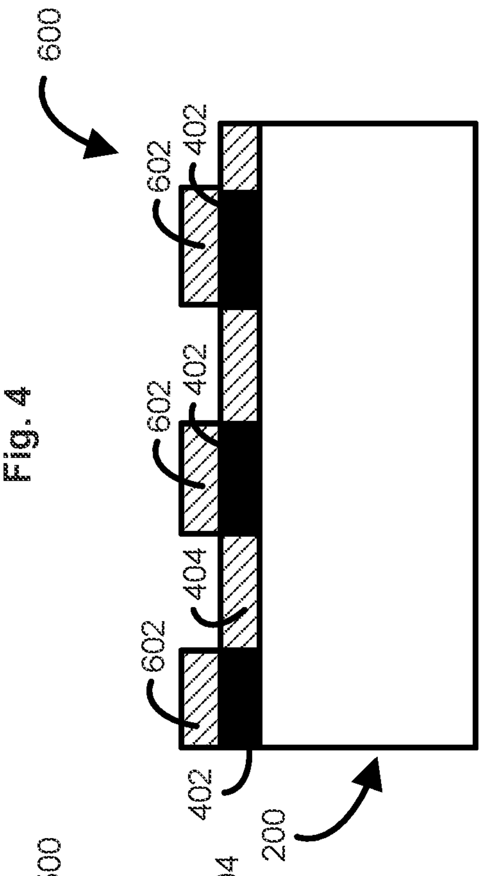

FIG. 6 illustrates a structure 600, in which material 602 is selectively deposited (e.g., directly) onto exposed portions 402. In this case, layer comprising an oxalate compound 210 can be thought of as a positive-tone resist-like material.

Step 110 can be or include a cyclical deposition process, such as a cyclical CVD or ALD process. By way of examples, step 110 can include cyclical deposition (e.g., ALD) of a metal such as copper, cobalt, tungsten, molybdenum, or aluminum; an (e.g., metal) oxide such as aluminum oxide or titanium oxide; an SiOCN material; a (e.g., meta)l nitride, a carbide, amongst others. It shall be understood that the term "SiOCN material" can refer to stoichiometric and non-stoichiometric materials comprising silicon oxide, silicon carbide, silicon nitride, and mixtures thereof.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

We claim:

1. A method of forming patterned features on a surface of a substrate, the method comprising the steps of:

providing a substrate within a gas-phase reaction chamber;

providing an oxalate derivative precursor to the reaction chamber; and forming a layer comprising an oxalate compound on a surface of the substrate within the reaction chamber, wherein the oxalate derivative precursor comprises a compound having a chemical structure according to formula (i), (i)

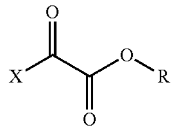

wherein X is a halogen and R is a hydrocarbyl group or a haloalkyl group.

2. The method of claim 1, wherein the oxalate derivative precursor comprises a halide.

3. The method of claim 1, wherein the oxalate derivative precursor comprises a hydrocarbyl oxalyl halide.

4. The method of claim 1, wherein the oxalate derivative precursor comprises chlorine.

5. The method of claim 1, wherein R is a linear alkyl, a cyclic alkyl, a linear alkenyl, a cyclic alkenyl, or an aryl.

6. The method of claim 1, wherein the layer comprising the oxalate compound forms a self-assembled monolayer on the surface.

7. The method of claim 1, wherein the surface comprises an oxide.

8. The method of claim 1, wherein the surface comprises a metal oxide.

9. The method of claim 1, wherein the surface comprises one or more of silicon oxide and silicon oxycarbide.

10. The method of claim 1, further comprising a step of exposing portions of the layer comprising an oxalate compound to one or more of radiation and excited species to form exposed portions and unexposed portions.

11. The method of claim 10, wherein the step of exposing comprises exposing the portions to extreme ultraviolet radiation.

12. The method of claim 10, wherein the step of exposing alters a hydrophobicity of the exposed portions.

13. The method of claim 10, further comprising a step of selectively depositing material on the exposed portions, wherein the step of selectively depositing material comprises a cyclical deposition process.

14. The method of claim 13, wherein the step of selectively depositing material comprises depositing material comprising a metal.

15. The method of claim 13, wherein the step of selectively depositing material comprises depositing material selected from the group consisting of a metal, an oxide, a carbide, and a nitride.

16. The method of claim 10, further comprising a step of selectively depositing material on the unexposed portions.

17. The method of claim 16, wherein the step of selectively depositing material comprises depositing material selected from the group consisting of a metal, an oxide, a carbide, and a nitride.

18. A method of forming patterned features on a surface of a substrate, the method comprising the steps of:

providing a substrate within a gas-phase reaction chamber;

providing an oxalate derivative precursor to the reaction chamber;

forming a layer comprising an oxalate compound on the surface of the substrate within the reaction chamber;

exposing portions of the layer comprising an oxalate compound to one or more of radiation and excited species to form exposed portions and unexposed portions of the layer; and selectively depositing material on the exposed portions or the unexposed portions, wherein the oxalate derivative precursor comprises a compound having a chemical structure according to formula (i), (i)

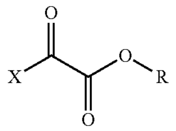

wherein X is a halogen and R is a hydrocarbyl group or a haloalkyl group.

19. A structure formed according to the method of claim 1.

20. A method of forming patterned features on a surface of a substrate, the method comprising the steps of:

providing a substrate within a gas-phase reaction chamber;

providing an oxalate derivative precursor to the reaction chamber;

forming a layer comprising an oxalate compound on a surface of the substrate within the reaction chamber; and exposing portions of the layer comprising an oxalate compound to one or more of radiation and excited species to form exposed portions and unexposed portions, wherein the oxalate derivative precursor comprises a halide, and wherein the oxalate derivative precursor comprises a compound having a chemical structure according to formula (i), (i)

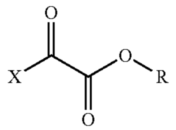

wherein X is a halogen and R is a hydrocarbyl group or a haloalkyl group.

* * * * *